(12) United States Patent
Kitada (10) Patent No.: US 8,657,417 B2
(45) Date of Patent: Feb. 25, 2014

(54) PIEZOELECTRIC ELEMENT, LIQUID EJECTING HEAD, AND LIQUID EJECTING APPARATUS

(75) Inventor: Kazuya Kitada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/354,370

(22) Filed: Jan. 20, 2012

(65) Prior Publication Data

US 2012/0188313 A1     Jul. 26, 2012

(30) Foreign Application Priority Data

Jan. 24, 2011   (JP) ................. 2011-012382

(51) Int. Cl.
| | | |
|---|---|---|
| *B41J 2/045* | (2006.01) | |
| *C04B 35/495* | (2006.01) | |
| *H01L 41/18* | (2006.01) | |
| *H01L 41/187* | (2006.01) | |
| *C04B 35/00* | (2006.01) | |
| *H01L 41/04* | (2006.01) | |

(52) U.S. Cl.
USPC ................ 347/71; 252/62.9 R; 252/62.9 PZ; 310/311

(58) Field of Classification Search
None
See application file for complete search history.

(56) References Cited

U.S. PATENT DOCUMENTS

| | | | | |
|---|---|---|---|---|
| 7,274,133 | B2 * | 9/2007 | Takeuchi et al. ............ | 310/365 |
| 2009/0267998 | A1 * | 10/2009 | Sakashita et al. ............ | 347/68 |
| 2009/0273651 | A1 * | 11/2009 | Kazama et al. ............. | 347/68 |
| 2011/0216134 | A1 * | 9/2011 | Hamada .................... | 347/71 |

FOREIGN PATENT DOCUMENTS

| | | | |
|---|---|---|---|
| JP | 2001-223404 | | 8/2001 |
| JP | 2009298621 | A * | 12/2009 |
| WO | WO 2010114148 | A1 * | 10/2010 |

* cited by examiner

*Primary Examiner* — Lisa M Solomon
(74) *Attorney, Agent, or Firm* — Workman Nydegger (57) ABSTRACT

A piezoelectric element, comprises a piezoelectric layer consisting of a complex oxide represented as a mixed crystal including bismuth ferrate and barium titanate and an electrode provided to the piezoelectric layer. The piezoelectric layer contains 1 to 15 mol % of lithium relative to the complex oxide.

5 Claims, 10 Drawing Sheets

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2011-012382, filed Jan. 24, 2011 is expressly incorporated by reference.

BACKGROUND

1. Technical Field

The present invention relates to a liquid ejecting head provided with a piezoelectric element which causes a change in the pressure of pressure generating chambers communicating with nozzle openings and which has a piezoelectric layer and electrodes which apply a voltage to the piezoelectric layer, a liquid ejecting apparatus, and a piezoelectric element.

2. Related Art

Mentioned as the piezoelectric element is one in which a piezoelectric layer (piezoelectric film) containing a piezoelectric material which exhibits an electromechanical conversion function, e.g., a crystallized piezoelectric material, is sandwiched between two electrodes. Such a piezoelectric element is mounted as an actuator device of a bending vibration mode, for example, on a liquid ejecting head. Mentioned as a typical example of the liquid ejecting head is, for example, an ink jet recording head in which a part of pressure generating chambers communicating with nozzle openings which eject ink droplets is constituted by a diaphragm, and the diaphragm is transformed by a piezoelectric element to pressurize ink in the pressure generating chambers, whereby the ink is ejected from the nozzle openings in the form of ink droplets.

The piezoelectric material used as the piezoelectric layer constituting such a piezoelectric element has been required to have high piezoelectric properties, and lead zirconate titanate (PZT) is mentioned as a typical example thereof (JP-A-2001-223404). However, a piezoelectric material in which the lead content is reduced has been demanded from the viewpoint of environmental problems. Mentioned as piezoelectric materials not containing lead are $BiFeO_3$ piezoelectric materials containing Bi and Fe, for example. Mentioned as a specific example thereof are complex oxides represented as a mixed crystal of bismuth ferrate manganate, such as $Bi(Fe, Mn)O_3$ and barium titanate, such as $BaTiO_3$, (e.g., JP-A-2009-252789).

However, when the piezoelectric material containing the mixed crystal of bismuth ferrate manganate and barium titanate is used as the piezoelectric layer, there is a problem in that cracking is likely to occur. Such a problem is not limited to the liquid ejecting head typified by the ink jet recording head, and similarly arises in other piezoelectric elements.

SUMMARY

An advantage of some aspects of the invention is to provide a liquid ejecting head provided with a piezoelectric element having a piezoelectric layer in which the lead content is reduced and the occurrence of cracking is suppressed, a liquid ejecting apparatus, and a piezoelectric element.

An embodiment of the invention which solves the above-described problem provides a liquid ejecting head having a pressure generating chamber communicating with a nozzle opening and a piezoelectric element having a piezoelectric layer and an electrode provided on the piezoelectric layer, in which the piezoelectric layer contains a piezoelectric material containing 1 to 15 mol % of lithium relative to a complex oxide having a perovskite structure represented as a mixed crystal of bismuth ferrate manganate and barium titanate.

According to the embodiment, by using the piezoelectric layer containing the piezoelectric material containing 1 to 15 mol % of lithium relative to a complex oxide having a perovskite structure represented as the mixed crystal of bismuth ferrate manganate and barium titanate, the occurrence of cracking in the piezoelectric layer can be suppressed.

The piezoelectric layer preferably contains a piezoelectric material containing 1 to 10 mol % of lithium relative to the complex oxide. According to the configuration, a liquid ejecting head is obtained in which the occurrence of cracking in the piezoelectric layer is suppressed and also a hetero phase is not contained.

The lithium may be contained in the A site of the complex oxide having a perovskite structure. According to the configuration, a liquid ejecting head is obtained which has a piezoelectric layer further containing lithium in the A site of the complex oxide having a perovskite structure represented as the mixed crystal of bismuth ferrate manganate and barium titanate and the occurrence of cracking is suppressed.

Another embodiment of the invention provides a liquid ejecting apparatus having the above-described liquid ejecting head. According to the embodiment, since the piezoelectric layer in which the occurrence of cracking is suppressed is provided, a liquid ejecting apparatus excellent in reliability is obtained.

Another embodiment of the invention provides a piezoelectric element having a piezoelectric layer and an electrode provided on the piezoelectric layer, in which the piezoelectric layer contains a piezoelectric material containing 1 to 15 mol % of lithium relative to a complex oxide having a perovskite structure represented as a mixed crystal of bismuth ferrate manganate and barium titanate. According to the embodiment, by using the piezoelectric layer containing the piezoelectric material containing 1 to 15 mol % of lithium relative to a complex oxide having a perovskite structure represented as a mixed crystal of bismuth ferrate manganate and barium titanate, the occurrence of cracking in the piezoelectric layer can be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
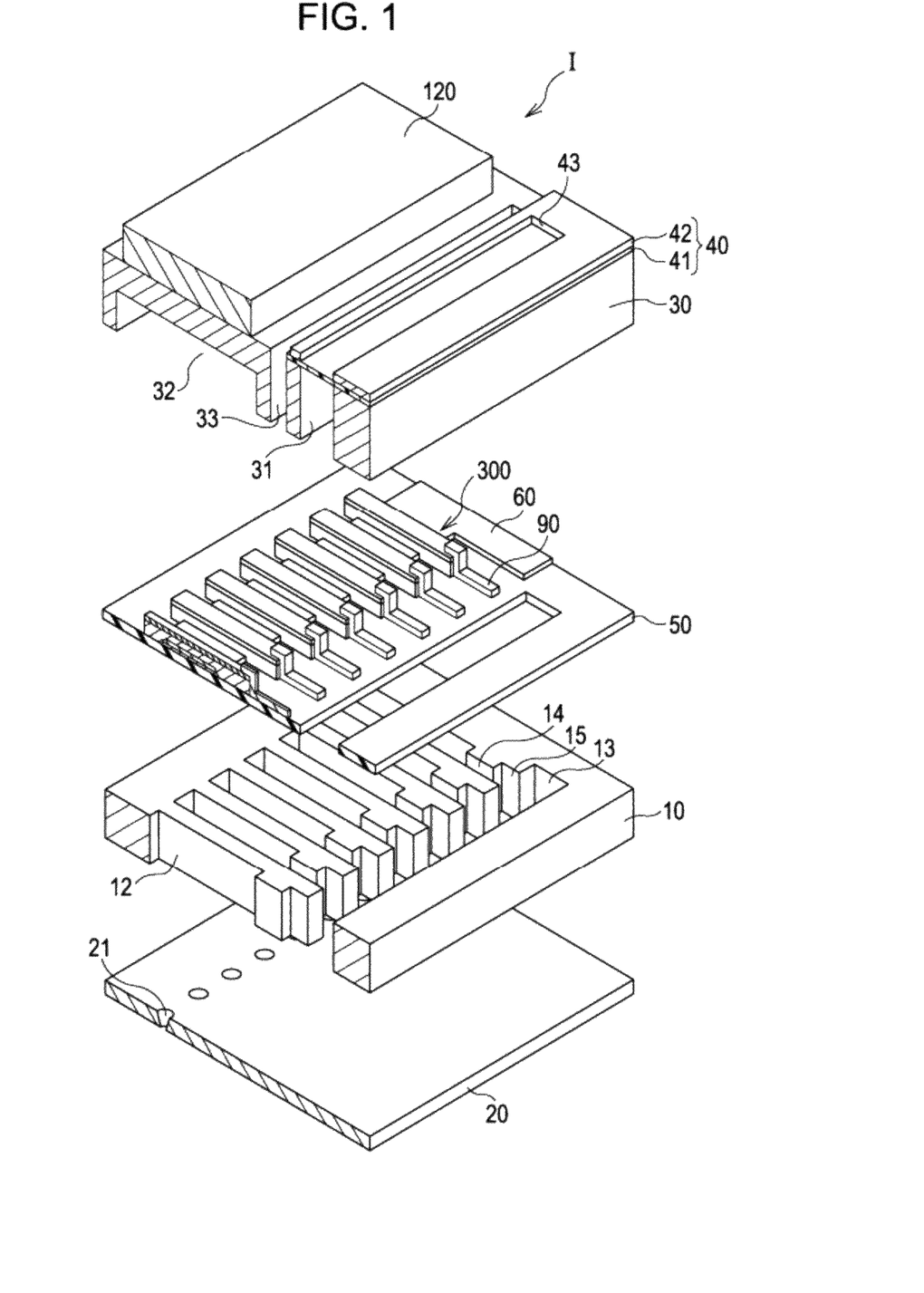
FIG. 1 is an exploded perspective view schematically illustrating the structure of a recording head according to a first embodiment.
Figure 2:
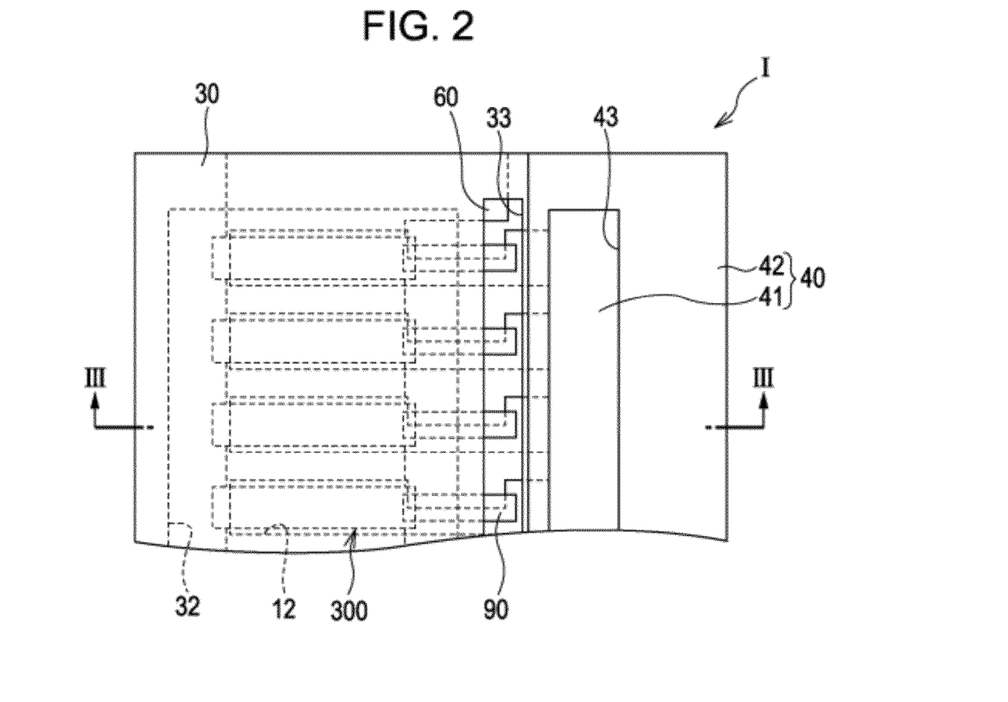
FIG. 2 is a plan view of the recording head according to the first embodiment.
Figure 3:
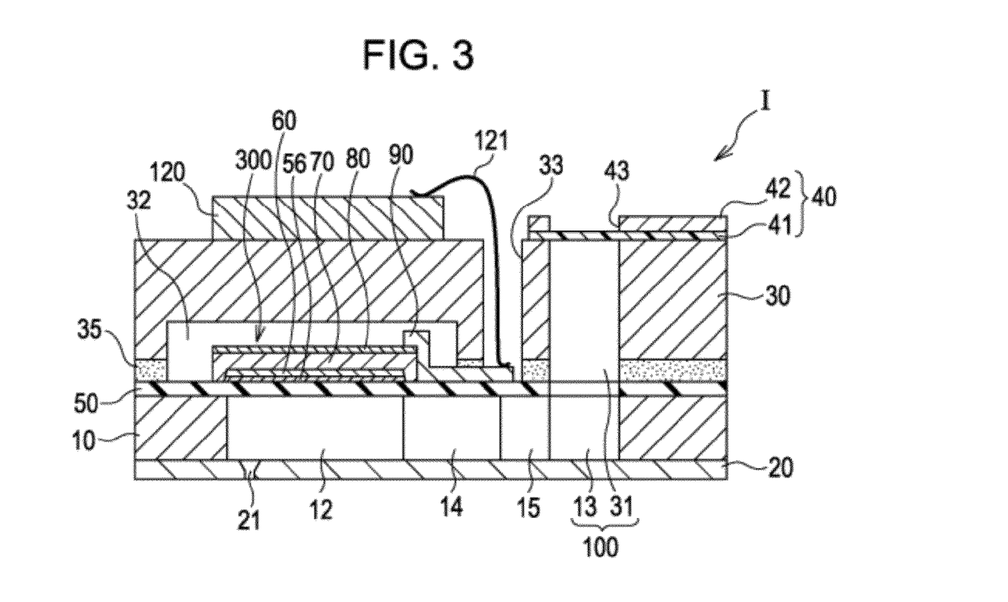
FIG. 3 is a cross sectional view of the recording head according to the first embodiment.

FIG. 1 is an exploded perspective view schematically illustrating the structure of an ink jet recording head which is an example of a liquid ejecting head according to a first embodiment of the invention. FIG. 2 is a plan view of FIG. 1. FIG. 3 is a cross sectional view along the III-III line of FIG. 2. As illustrated in FIGS. 1 to 3, a flow path formation substrate 10 of this embodiment contains a silicon single crystal substrate, and an elastic film 50 containing silicon dioxide is formed on one surface thereof.

In the flow path formation substrate 10, a plurality of pressure generating chambers 12 are arranged in parallel in the width direction. Moreover, a communication portion 13 is formed in a region at the outside in the longitudinal direction of the pressure generating chambers 12 of the flow path formation substrate 10, and the communication portion 13 and each pressure generating chamber 12 are made to communicate with each other through an ink supply path 14 and a communication path 15 provided every pressure generating chamber 12. The communication portion 13 communicates with a manifold portion 31 of a protective substrate described later to constitute a part of a manifold serving as a common ink chamber of the respective pressure generating chambers 12. The ink supply paths 14 are formed with a width narrower than that of the pressure generating chambers 12 and maintain the flow path resistance of ink flowing into the pressure generating chambers 12 from the communication portion 13 at a fixed level. In this embodiment, the ink supply paths 14 are formed by reducing the width of the flow path from one side but the ink supply paths may be formed by reducing the width of the flow path from both sides. Or, the ink supply paths may be formed by not reducing the width of the flow path but reducing the thickness thereof. In this embodiment, the flow path formation substrate 10 is provided with a liquid flow path containing the pressure generating chambers 12, the communication portion 13, the ink supply paths 14, and the communication paths 15.

To an opening surface side of the flow path formation substrate 10, a nozzle plate 20 in which nozzle openings 21 are formed which communicate the vicinity of the end portion at the side opposite to the ink supply path 14 of each pressure generating chamber 12 is adhered with an adhesive, a thermal fusing film, or the like. The nozzle plate 20 contains, for example, glass ceramics, a silicon single crystal substrate, stainless steel, or the like.

In contrast, the elastic film 50 is formed on the surface opposite to the opening surface of such a flow path formation substrate 10 as described above. On the elastic film 50, an adhesion layer 56 is provided which contains titanium oxide having a thickness of about 30 to 50 nm or the like, for example, and which increases the adhesiveness with the foundation of a first electrode 60 of the elastic film 50 or the like. On the elastic film 50, an insulator film containing zirconium dioxide or the like may be provided as required.

Furthermore, on this adhesion layer 56, a first electrode 60, an piezoelectric layer 70 which is a thin film having a thickness of 2 μm or lower and preferably 0.3 to 1.5 μm, and a second electrode 80 are laminated to constitute a piezoelectric element 300. Herein, the piezoelectric element 300 refers to a portion containing the first electrode 60, the piezoelectric layer 70, and the second electrode 80. In general, the piezoelectric element 300 is configured so that either one of the electrodes of the piezoelectric element 300 is used as a common electrode and the other electrode and the piezoelectric layer 70 are patterned every pressure generating chamber 12. In this embodiment, the first electrode 60 is used as the common electrode of the piezoelectric element 300 and the second electrode 80 is used as an individual electrode of the piezoelectric element 300. However, even when the configuration is reversed due to a drive circuit or wiring, no problems arise. Herein, the piezoelectric element 300 and a diaphragm which causes displacement by the drive of the piezoelectric element 300 are collectively referred to as an actuator device. In the above-described example, the elastic film 50, the adhesion layer 56, the first electrode 60, and the insulator film provided as required acts as a diaphragm. However, it is a matter of course that the invention is not limited thereto and the elastic film 50 or the adhesion layer 56 may not be provided, for example. It may be configured so that the piezoelectric element 300 itself substantially serves also as a diaphragm.

In the invention, the piezoelectric material constituting the piezoelectric layer 70 is one containing 1 to 15 mol % of lithium relative to a complex oxide having a perovskite structure represented as the mixed crystal of bismuth ferrate manganate and barium titanate.

In detail, as described in JP-A-2009-252789, known as the piezoelectric material is a complex oxide represented as the mixed crystal of bismuth ferrate manganate and barium titanate, i.e., a complex oxide represented as a solid solution in which bismuth ferrate manganate and barium titanate forms a uniform solid solution. In this embodiment, a piezoelectric material obtained by adding raw materials containing lithium, such as lithium methoxide and lithium 2-ethylhexanoate, when manufacturing the complex oxide represented as the mixed crystal of bismuth ferrate manganate and barium titanate, is formed into the piezoelectric layer 70. In the X ray diffraction pattern, the bismuth ferrate manganate or the barium titanate is not solely detected.

Furthermore, in the invention, the piezoelectric layer 70 is one containing 1 to 15 mol % of lithium relative to the complex oxide having a perovskite structure represented as the mixed crystal of bismuth ferrate manganate and barium titanate.

Thus, when one containing 1 to 15 mol % of lithium relative to the complex oxide having a perovskite structure represented as the mixed crystal of bismuth ferrate manganate and barium titanate is used as the piezoelectric material constituting the piezoelectric layer 70, the occurrence of cracking in the piezoelectric layer 70 can be suppressed as compared with a system not containing lithium, i.e., the complex oxide represented as the mixed crystal of bismuth ferrate manganate and barium titanate, as shown in Examples described later. Therefore, an ink jet recording head excellent in reliability is obtained.

In such a piezoelectric layer 70, it is presumed that lithium is present in the grain boundary of the complex oxide having a perovskite structure or in the A site of the complex oxide having a perovskite structure. In the A site of the perovskite structure, i.e., $ABO_3$ structure, 12 oxygen atoms are coordinated and, in the B site, 6 oxygen atoms are coordinated to form a octahedron. In the A site, Bismuth (Bi) and barium (Ba) are located and, in the B site, iron (Fe), manganese (Mn), and titanium (Ti) are located, and it is presumed that lithium replaces a part of the bismuth or the barium in the A site.

When the piezoelectric layer 70 contains 1 to 15 mol % of lithium relative to the complex oxide having a perovskite structure represented as the mixed crystal of bismuth ferrate manganate and barium titanate, it can be configured so that a hetero phase is not contained.

To each second electrode 80 which is an individual electrode of such a piezoelectric element 300, a lead electrode 90 containing, for example, gold (Au) or the like which is drawn out from the vicinity of the end portion at the side of the ink supply paths 14 to be extended onto the elastic film 50 or the insulator film provided as required is connected.

Onto the flow path formation substrate 10 on which such a piezoelectric element 300 is formed, i.e., on the first electrode 60, the elastic film 50, the insulator film provided as required, and the lead electrode 90, a protective substrate 30 having the manifold portion 31 constituting at least one part of the manifold 100 is bonded through an adhesive 35. In this embodiment, the manifold portion 31 is formed penetrating the protective substrate 30 in the thickness direction over the width direction of the pressure generating chambers 12 and is made to communicate with the communication portion 13 of the flow path formation substrate 10 to constitute the manifold 100 which serves as a common ink chamber of the respective pressure generating chamber 12 as described above. The communication portion 13 of the flow path formation substrate 10 may be divided into a plurality of parts every pressure generating chamber 12, so that only the manifold portion 31 may be used as a manifold. Furthermore, for example, only the pressure generating chambers 12 may be provided in the flow path formation substrate 10, and the ink supply paths 14 communicating the manifold 100 and each pressure generating chamber 12 may be provided in a member (e.g., the elastic film 50, the insulator film provided as required, etc.) interposed between the flow path formation substrate 10 and the protective substrate 30.

In a region facing the piezoelectric element 300 of the protective substrate 30, a piezoelectric element holding portion 32 having a space large enough not to inhibit the movement of the piezoelectric element 300 is provided. The piezoelectric element holding portion 32 may have a space large enough not to inhibit the movement of the piezoelectric element 300, and the space may be or may not be sealed.

As such a protective substrate 30, a material having substantially the same coefficient of thermal expansion as that of the flow path formation substrate 10, e.g., glass and ceramic materials, is preferably used. In this embodiment, a silicon single crystal substrate which is the same material as the flow path formation substrate 10 is used for the formation thereof.

The protective substrate 30 is provided with a through hole 33 penetrating the protective substrate 30 in the thickness direction. The vicinity of the end portion of the lead electrode 90 drawn out from each piezoelectric element 300 is provided to be exposed to the inside of the through hole 33.

On the protective substrate 30, a drive circuit 120 for driving the piezoelectric elements 300 arranged in parallel is fixed. As the drive circuit 120, a circuit substrate, a semiconductor integrated circuit (IC), or the like can be used, for example. The drive circuit 120 and the lead electrode 90 are electrically connected through a connection wiring 121 containing a conductive wire, such as a bonding wire.

Onto such a protective substrate 30, a compliance substrate 40 containing a sealing film 41 and a fixation plate 42 is bonded. Herein, the sealing film 41 contains a material having a low rigidity and flexibility, and the sealing film 41 seals one surface of the manifold portion 31. The fixation plate 42 is formed with a relatively hard material. A region facing the manifold 100 of the fixation plate 42 is completely removed in the thickness direction to form an opening portion 43, and therefore one surface of the manifold 100 is sealed only by the sealing film 41 having flexibility.

In such an ink jet recording head I of this embodiment, ink is taken in from an ink introduction port connected to an ink supply unit (not illustrated) at the outside, the inside of a space from the manifold 100 to the nozzle opening 21 is filled with the ink, and thereafter a voltage is applied to the first electrode 60 and the second electrode 80 corresponding to each of the pressure generating chambers 12 in accordance with a recording signal from the drive circuit 120 to bend and transform the elastic film 50, the adhesion layer 56, the first electrode 60, and the piezoelectric layer 70, so that the pressure in each pressure generating chamber 12 increases, and ink droplets are ejected from the nozzle openings 21.

Next, an example of a method for manufacturing the ink jet recording head of this embodiment is described with reference to FIGS. 4 to 8. FIGS. 4 to 8 are cross sectional views in the longitudinal direction of the pressure generating chamber.

Figure 4A:
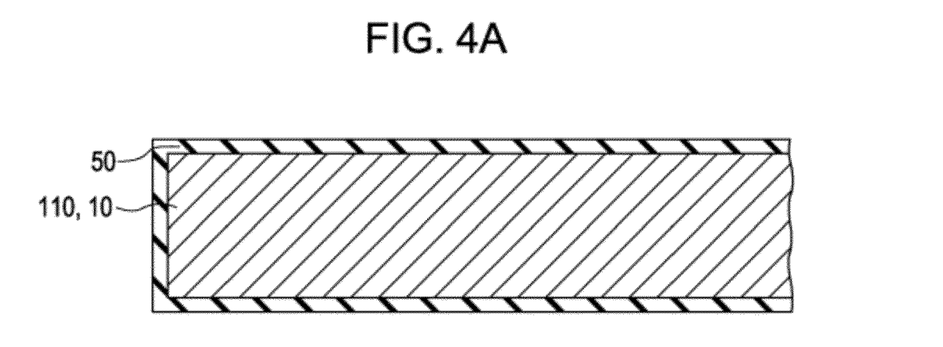
FIGS. 4A and 4B are cross sectional views illustrating manufacturing processes of the recording head according to the first embodiment.
Figure 4B:
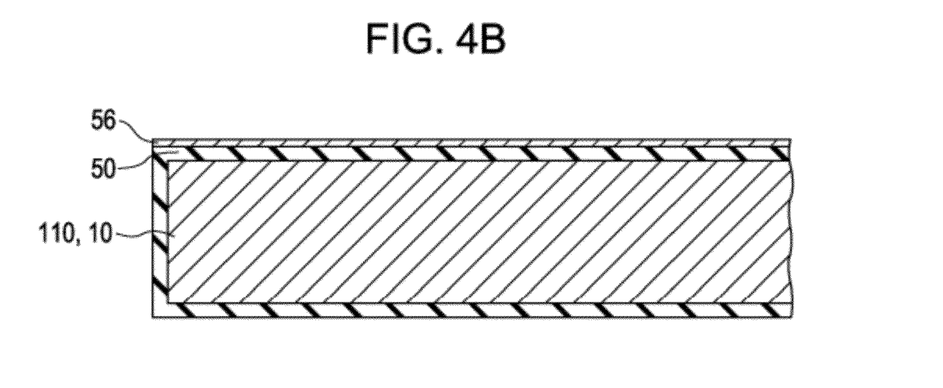

First, as illustrated in FIG. 4A, a silicon dioxide film containing silicon dioxide ($SiO_2$) or the like constituting the elastic film 50 is formed by thermal oxidation or the like on the surface of a flow path formation substrate wafer 110 which is a silicon wafer. Subsequently, as illustrated in FIG. 4B, the adhesion layer 56 containing titanium oxide or the like is formed on the elastic film 50 (silicon dioxide film) by sputtering, thermal oxidation, or the like.

Figure 5A:
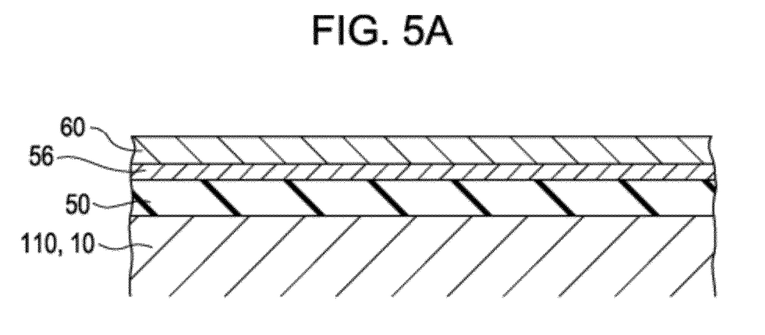
FIGS. 5A to 5C are cross sectional views illustrating manufacturing processes of the recording head according to the first embodiment.

Next, as illustrated in FIG. 5A, the first electrode 60 containing platinum, iridium, iridium oxide, or a laminated structure thereof is formed on the entire surface of the adhesion layer 56 by sputtering or the like.

Subsequently, the piezoelectric layer 70 is laminated on the platinum film. A method for manufacturing the piezoelectric layer 70 is not particularly limited. For example, the piezoelectric layer 70 can be manufactured using a chemical solution method, such as an MOD (Metal-Organic Decomposition) method or a sol-gel method including applying a solution containing organometallic compounds and drying the same, and then further baking the same at a high temperature to thereby obtain a piezoelectric layer (piezoelectric film) containing metal oxide. In addition thereto, the piezoelectric layer 70 can also be manufactured by a laser ablation method, a sputtering method, a pulsed laser deposition method (PLD method), a CVD method, an aerosol deposition method, or the like.

Figure 5B:
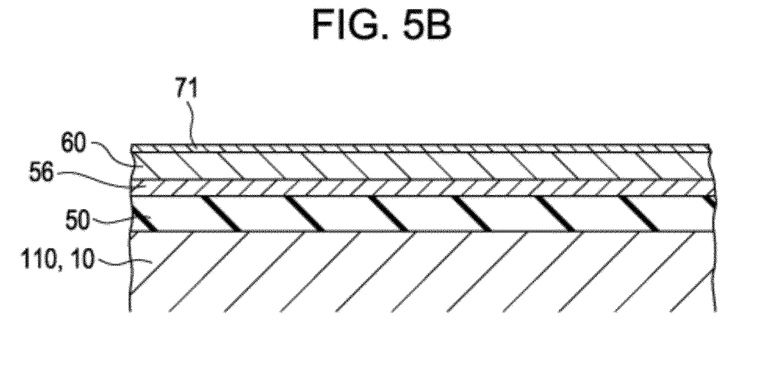

As a specific example of a formation procedure for forming the piezoelectric layer 70 by the chemical solution method, first, a piezoelectric film formation composition (precursor solution) containing an MOD solution or a sol containing organometallic compounds, specifically, organometallic compounds containing Bi, Fe, Mn, Ba, Ti, and Li, is applied onto the first electrode 60 using a spin coat method or the like to thereby form a piezoelectric body precursor film 71 as illustrated in FIG. 5B (application process).

The precursor solution to apply is one obtained by mixing organometallic compounds each containing Bi, Fe, Mn, Ba, Ti, and Li, and dissolving or dispersing the mixture using organic solvents, such as alcohol. The mixing ratio of the organometallic compounds each containing Bi, Fe, Mn, Ba, and Ti is determined in such a manner as to form a desired complex oxide having a perovskite structure represented as the mixed crystal of bismuth ferrate manganate and barium titanate. The mixing ratio of the organometallic compound containing Li is determined in such a manner that the Li content is 1 to 15 mol % relative to the complex oxide. As the organometallic compounds each containing Bi, Fe, Mn, Ba, and Ti, a metal alkoxide, an organic metal complex, and the like can be used, for example. As the organometallic compound containing Bi, bismuth 2-ethylhexanoate and the like are mentioned, for example. As the organometallic compound containing Fe, iron 2-ethylhexanoate and the like are mentioned, for example. As the organometallic compound containing Mn, manganese 2-ethylhexanoate and the like are mentioned, for example. As the organometallic compound containing Ba, barium diethoxide, barium 2-ethylhexanoate, barium acetylacetonato, and the like are mentioned, for example. As the organometallic compound containing Ti, titanium isopropoxide, titanium 2-ethylhexanoate, titanium (di-i-propoxide)bis(acetylacetonato), and the like are mentioned, for example. It is a matter of course that an organometallic compound containing two or more kinds of Bi, Fe, Mn, Ba, and Ti may be used. As raw materials containing Li, lithium methoxide, lithium 2-ethylhexanoate, and the like are mentioned. It is a matter of course that two or more kinds of materials containing Li may be used.

Subsequently, the piezoelectric precursor film 71 is heated to a predetermined temperature (e.g., 150 to 200° C.), and is dried for a given period of time (drying process). Next, the dried piezoelectric precursor film 71 is heated to a predetermined temperature (e.g., 350 to 450° C.), and then held for a given period of time for degreasing (degreasing process). The degreasing as used herein is to remove the organic components contained in the piezoelectric precursor film 71 as $NO_2$, $CO_2$, $H_2O$, and the like, for example. The atmosphere of the drying process or the degreasing process is not limited, and the processes may be performed in the air, an oxygen atmosphere, or inactive gas. The application process, the drying process, and the degreasing process may be performed two or more times.

Figure 5C:
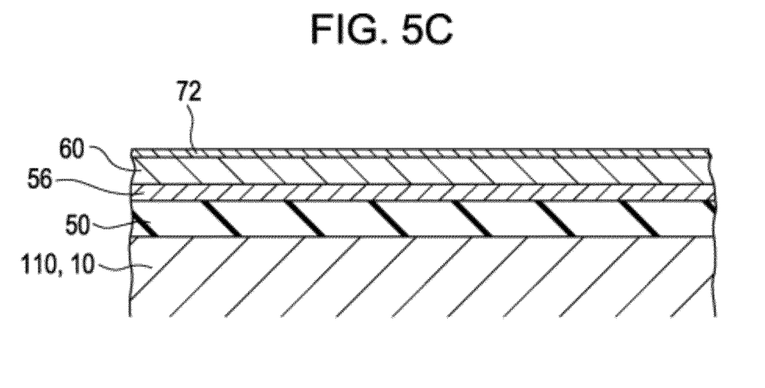

Next, as illustrated in FIG. 5C, the piezoelectric precursor film 71 is heated to a predetermined temperature, e.g., about 600 to 850° C., and then held for a given period of time, e.g., 1 to 10 minutes, for crystallizing to thereby form a piezoelectric film 72 containing a piezoelectric material containing 1 to 15 mol % of lithium relative to the complex oxide having a perovskite structure represented as the mixed crystal of bismuth ferrate manganate and barium titanate (baking process). Also in this baking process, the atmosphere is not limited, and the baking process may be performed in the air, an oxygen atmosphere, or inactive gas.

As a heating device for use in the drying process, the degreasing process, and the baking process, an RTA (Rapid Thermal Annealing) device which heats by irradiation of an infrared lamp, a hot plate, and the like are mentioned, for example.

Figure 6A:
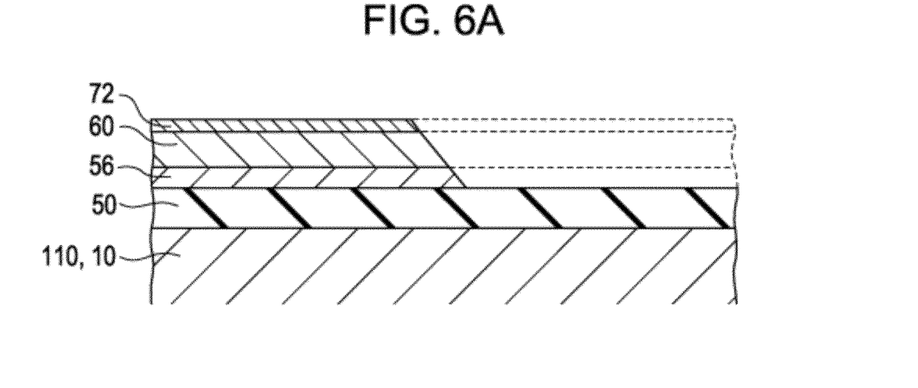
FIGS. 6A and 6B are cross sectional views illustrating manufacturing processes of the recording head according to the first embodiment.

Next, as illustrated in FIG. 6A, the first electrode 60 and a first layer of the piezoelectric film 72 are simultaneously patterned on the piezoelectric film 72 using a resist (not illustrated) having a predetermined shape as a mask in such a manner that the side surfaces thereof incline.

Figure 6B:
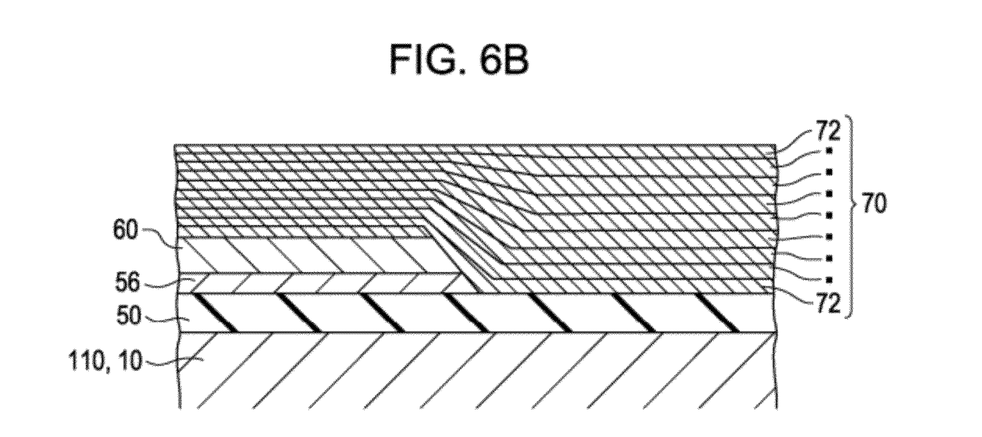

Subsequently, the resist is separated, and thereafter the application process, the drying process, and the degreasing process described above or the application process, the drying process, the degreasing process, and the baking process described above are repeated two or more times in accordance with a desired film thickness to thereby form the piezoelectric layer 70 containing a plurality of the piezoelectric films 72, whereby the piezoelectric layer 70 having a predetermined thickness containing a plurality of the piezoelectric films 72 is formed as illustrated in FIG. 6B. For example, when the film thickness per application of the application solution is about 0.1 μm, the film thickness of the entire piezoelectric layer 70 containing 10 layers of the piezoelectric films 72 is about 1.1 μm. In this embodiment, the piezoelectric films 72 are laminated, but only one piezoelectric film 72 may be acceptable.

Figure 7A:
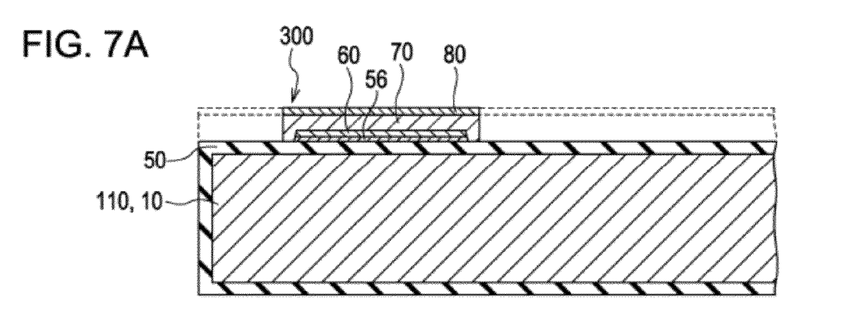
FIGS. 7A to 7C are cross sectional views illustrating manufacturing processes of the recording head according to the first embodiment.

After forming the piezoelectric layer 70 as described above, the second electrode 80 containing platinum or the like is formed on the piezoelectric layer 70 by sputtering or the like, and then the piezoelectric layer 70 and the second electrode 80 are simultaneously patterned in a region facing each pressure generating chamber 12, thereby forming the piezoelectric element 300 containing the first electrode 60, the piezoelectric layer 70, and the second electrode 80 as illustrated in FIG. 7A. The patterning of the piezoelectric layer 70 and the patterning of the second electrode 80 can be collectively carried out by performing dry etching through a resist (not illustrated) formed into a predetermined shape. Thereafter, for example, annealing may be performed in a temperature range of 600 to 850° C. as required. Thus, a good interface of the piezoelectric layer 70 and the first electrode 60 or the second electrode 80 can be formed and the crystallinity of the piezoelectric layer 70 can be improved.

Figure 7B:
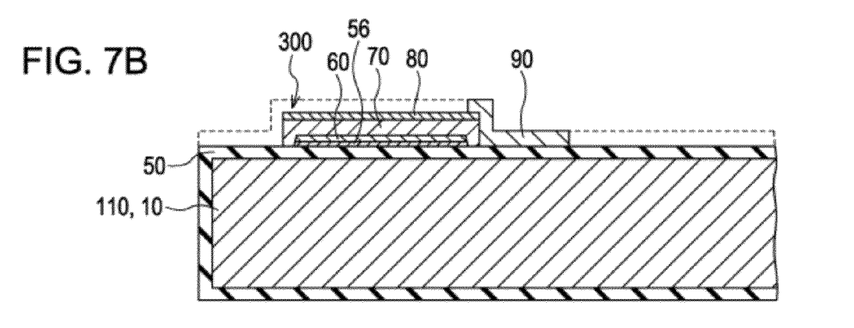

Next, as illustrated in FIG. 7B, the lead electrode 90 containing, for example, gold (Au) or the like is formed on the entire surface of the flow path formation substrate wafer 110, and thereafter patterned every piezoelectric element 300 through a mask pattern (not illustrated) containing resist or the like, for example.

Figure 7C:
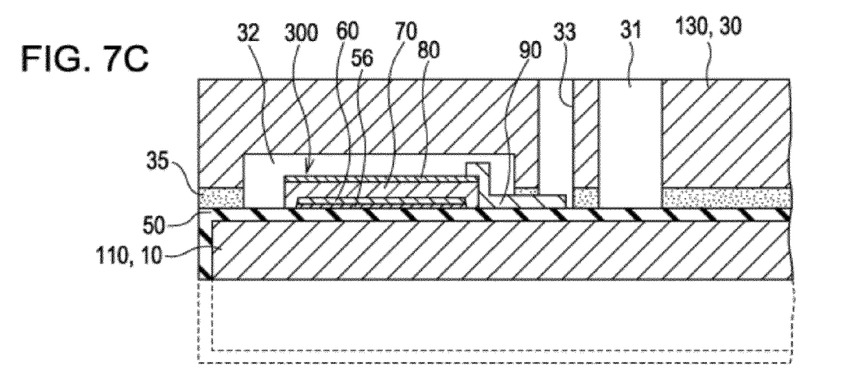

Next, as illustrated in FIG. 7C, a protective substrate wafer 130 which is a silicon wafer and serves as a plurality of protective substrates 30 is bonded to the piezoelectric element 300 side of the flow path formation substrate wafer 110 through the adhesive 35, and thereafter the thickness of the flow path formation substrates wafer 110 is reduced to a predetermined thickness.

Figure 8A:
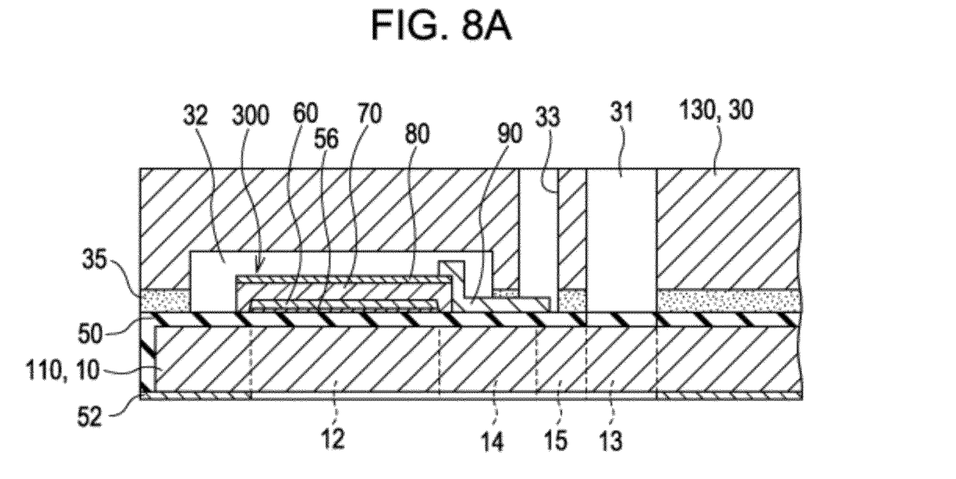
FIGS. 8A and 8B are cross sectional views illustrating manufacturing processes of the recording head according to the first embodiment.

Next, as illustrated in FIG. 8A, a mask film 52 is newly formed on the flow path formation substrate wafer 110, and then patterned into a predetermined shape.

Figure 8B:
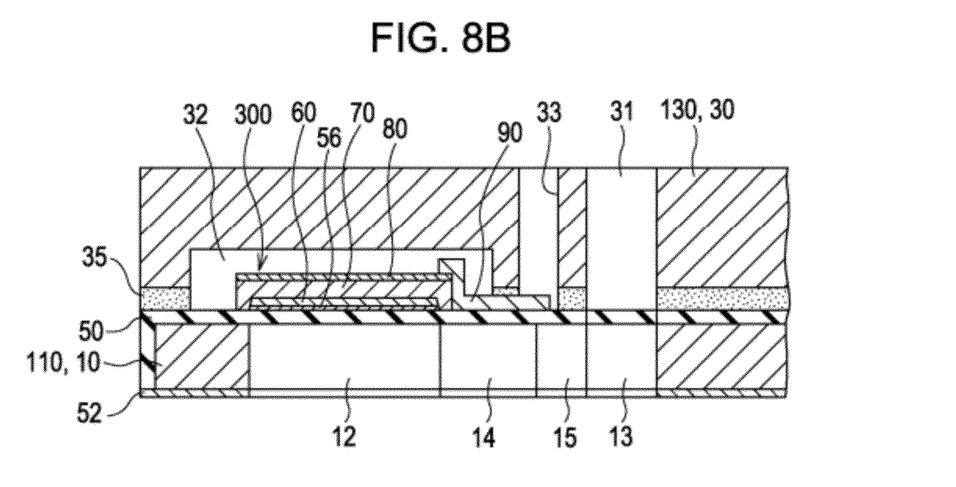

Then, as illustrated in FIG. 8B, by anisotropically etching (wet etching) the flow path formation substrate wafer 110 using an alkaline solution of KOH or the like through the mask film 52, the pressure generating chamber 12, the communication portion 13, the ink supply path 14, the communication path 15, and the like corresponding to the piezoelectric element 300 are formed.

Thereafter, unnecessary portions of the outer peripheral edge portion of the flow path formation substrate wafer 110 and the protective substrate wafer 130 are removed by cutting by dicing or the like, for example. Then, the mask film 52 on the surface opposite to the protective substrate wafer 130 of the flow path formation substrate wafer 110 is removed, the nozzle plate 20 in which the nozzle openings 21 are formed is bonded, the compliance substrate 40 is bonded to the protective substrate wafer 130, and then the flow path formation substrate wafer 110 and the like are divided into the flow path formation substrate 10 of one chip size and the like as illustrated in FIG. 1, thereby manufacturing the ink jet recording head I of this embodiment.

EXAMPLES

Hereinafter, Examples are shown, and the invention is more specifically described. The invention is not limited to the following Examples.

Example 1

First, a silicon oxide ($SiO_2$) film having a film thickness of 1000 nm was formed on the surface of a single crystal silicon (Si) substrate by thermal oxidation. Next, a titanium film having a film thickness of 40 nm was formed on the $SiO_2$ film by RF magnetron sputtering, followed by thermal oxidation, thereby forming a titanium oxide film. Furthermore, a platinum film (first electrode 60) which is oriented in the (111) plane and which has a film thickness of 100 nm was formed on the titanium oxide film by RF magnetron sputtering.

Subsequently, the piezoelectric layer 70 was formed on the first electrode 60 by spin coating. The technique is as follows. First, to an n-octane solvent solution of bismuth 2-ethylhexanoate, iron 2-ethylhexanoate, manganese 2-ethylhexanoate, barium 2-ethylhexanoate, and titanium 2-ethylhexanoate, an n-octane solvent solution of lithium 2-ethylhexanoate was added to thereby prepare a precursor solution.

Then, the precursor solution was added dropwise on the substrate on which the titanium oxide film and the platinum film were formed, and the substrate was rotated at 3000 rpm, thereby forming a piezoelectric precursor film (application process). Next, drying was performed at 180° C. for 2 minutes (drying process). Subsequently, degreasing was performed at 450° C. for 2 minutes (degreasing process). After a process including the application process, the drying process, and the degreasing process was repeatedly performed twice, baking was performed at 700° C. for 5 minutes in an oxygen atmosphere by an RTA (Rapid Thermal Annealing) device (baking process). Subsequently, a process including repeating the application process, the drying process, and the degreasing process twice, and thereafter performing the baking process for collectively baking was repeated 5 times, thereby forming the piezoelectric layer 70 having the total thickness of 584 nm by the ten application processes.

Thereafter, a platinum film having a film thickness of 100 nm was formed as the second electrode 80 on the piezoelectric layer 70 by DC sputtering, followed by baking at 700° C. for 5 minutes in an oxygen atmosphere using an RTA device, thereby forming the piezoelectric element 300 in which the piezoelectric layer 70 contained a piezoelectric material containing 1 mol % of lithium relative to a complex oxide having a perovskite structure represented as the mixed crystal of bismuth ferrate manganate and barium titanate, specifically a complex oxide represented by $0.75Bi(Fe_{0.95}, Mn_{0.05})O_3-0.25BaTiO_3$.

Example 2

The same operation as in Example 1 was performed, except changing the addition amount of lithium 2-ethylhexanoate to the precursor solution and forming a piezoelectric material containing 3 mol % of lithium relative to a complex oxide represented by $0.75Bi(Fe_{0.95}, Mn_{0.05})O_3-0.25BaTiO_3$ into the piezoelectric layer 70. The thickness of the piezoelectric layer was 629 nm.

Example 3

The same operation as in Example 1 was performed, except changing the addition amount of lithium 2-ethylhexanoate to the precursor solution and forming a piezoelectric material containing 5 mol % of lithium relative to a complex oxide represented by $0.75Bi(Fe_{0.95}, Mn_{0.05})O_3-0.25BaTiO_3$ into the piezoelectric layer 70. The thickness of the piezoelectric layer was 592 nm.

Example 4

The same operation as in Example 1 was performed, except changing the addition amount of lithium 2-ethylhexanoate to the precursor solution and forming a piezoelectric material containing 10 mol % of lithium relative to a complex oxide represented by $0.75Bi(Fe_{0.95}, Mn_{0.05})O_3-0.25BaTiO_3$ into the piezoelectric layer 70. The thickness of the piezoelectric layer was 634 nm.

Example 5

The same operation as in Example 1 was performed, except changing the addition amount of lithium 2-ethylhexanoate to the precursor solution and forming a piezoelectric material containing 15 mol % of lithium relative to a complex oxide represented by $0.75Bi(Fe_{0.95}, Mn_{0.05})O_3-0.25BaTiO_3$ into the piezoelectric layer 70. The thickness of the piezoelectric layer was 661 nm.

Comparative Example 1

The same operation as in Example 1 was performed, except not adding lithium 2-ethylhexanoate to the precursor solution and forming a complex oxide represented by $0.75Bi(Fe_{0.95}, Mn_{0.05})O_3-0.25BaTiO_3$ into the piezoelectric layer 70. The thickness of the piezoelectric layer was 609 nm.

Test Example 1

Figure 9A:
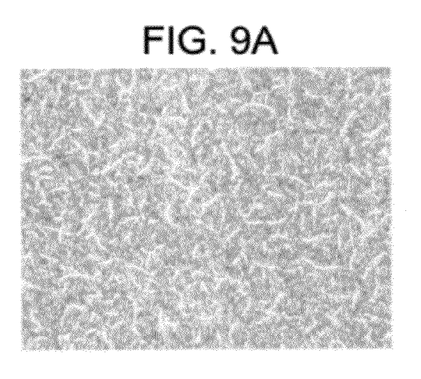
FIGS. 9A to 9F are photographs in which the surface of piezoelectric layers of Examples 1 to 5 and Comparative Example 1 is observed under a metallurgical microscope.
Figure 9B:
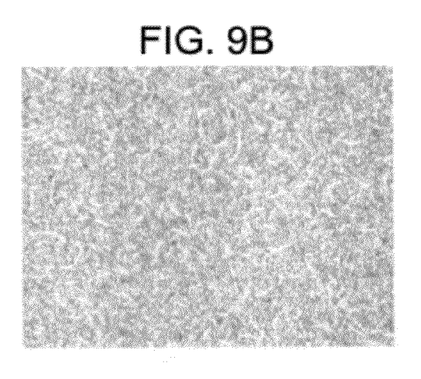
Figure 9C:
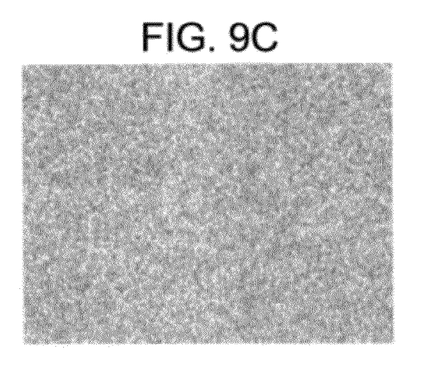
Figure 9D:
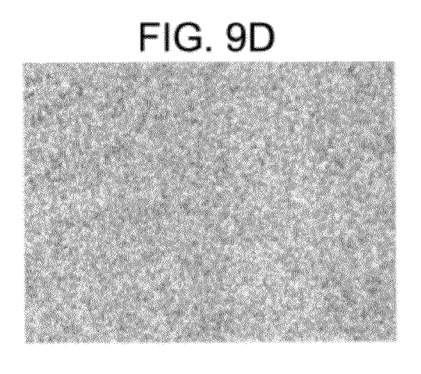
Figure 9E:
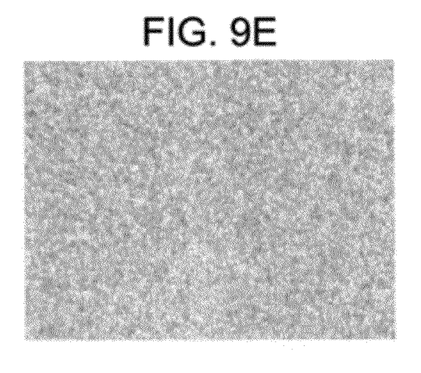
Figure 9F:
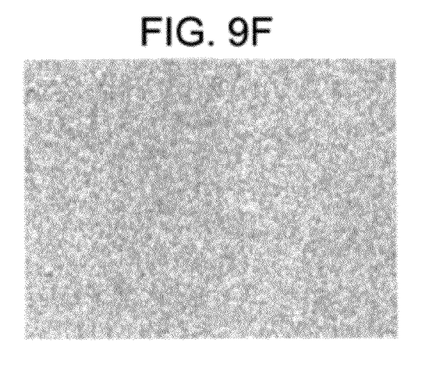

In Examples 1 to 5 and Comparative Example 1, the piezoelectric layer 70 in a state where the second electrode 80 was not formed was observed for the surface after 1 week passed after the formation under a metallurgical microscope (×500) at room temperature (25° C.). The result of Comparative Example 1 is shown in FIG. 9A. The result of Example 1 is shown in FIG. 9B. The result of Example 2 is shown in FIG. 9C. The result of Example 3 is shown in FIG. 9D. The result of Example 4 is shown in FIG. 9E. The result of Example 5 is shown in FIG. 9F.

As a result, the piezoelectric layers 70 of Comparative Example 1 and Examples 1 to 5 had almost the same thickness. However, a large number of cracks are formed in Comparative Example 1 in which Li was not contained, and, in contrast thereto, the occurrence of cracking was reduced in Examples 1 to 5 in which Li was contained. With an increase in the Li content, the occurrence of cracking is further reduced. In Examples 2 to 5 in which 3 to 15 mol % of Li was contained, no cracks were observed.

Test Example 2

Figure 10:
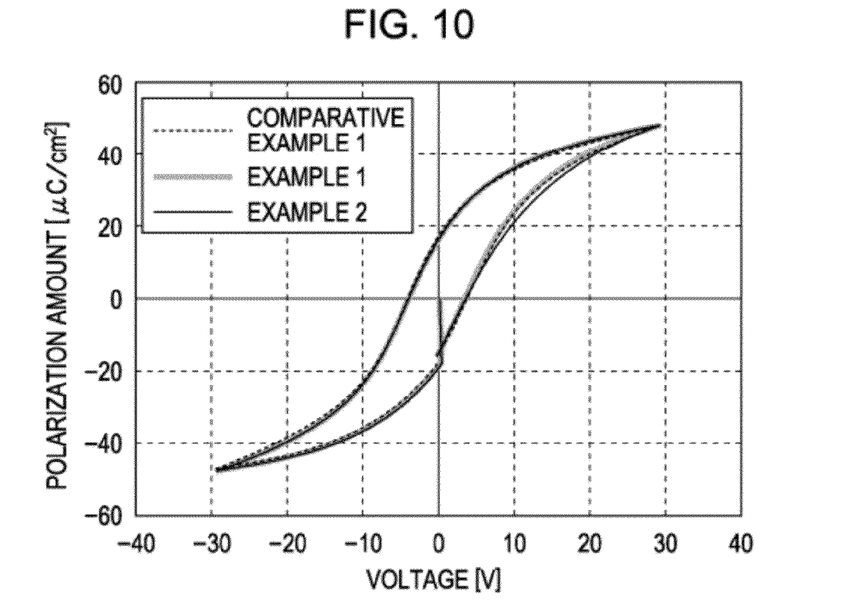
FIG. 10 is a view illustrating the P-V curves of Examples 1 to 2 and Comparative Example 1.

Each piezoelectric element of Examples 1 to 5 and Comparative Example 1 was observed for the relationship of P (Polarization amount)–V (Voltage) by applying a triangular wave of 1 kHz frequency at room temperature using an electrode pattern of φ=500 m by "FCE-1A" manufactured by TOYO Corp. One example of the results is shown in FIG. 10. As a result, Examples 1 to 5 and Comparative Example 1 exhibited ferroelectricity.

Test Example 3

Figure 11:
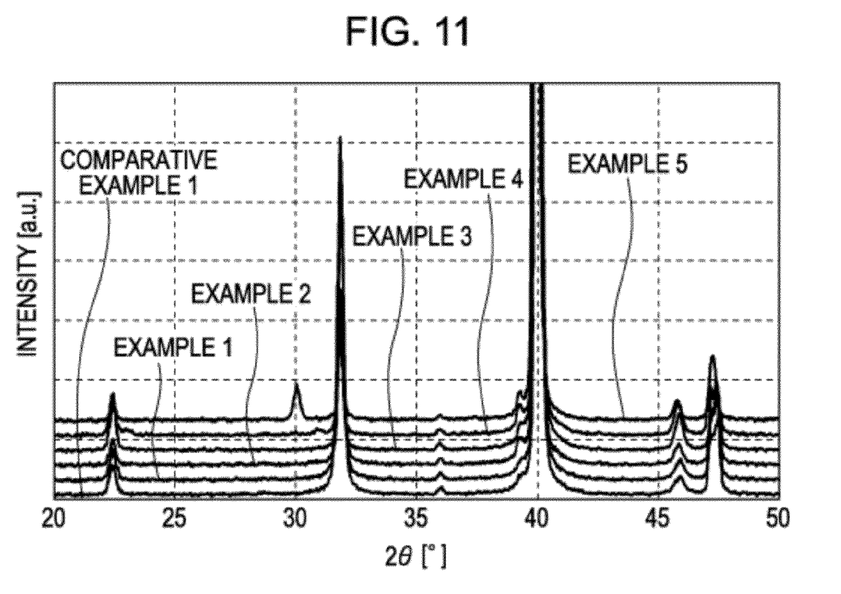
FIG. 11 is a view illustrating the X ray diffraction patterns of Examples 1 to 5 and Comparative Example 1.

In each piezoelectric element of Examples 1 to 5 and Comparative Example 1, the X-ray diffraction pattern of the piezoelectric layer 70 was determined at room temperature using "D8 Discover" manufactured by Bruker AXS using a CuKα line as the X-ray source. The results are shown in FIG. 11. As a result, in all Examples 1 to 5 and Comparative Example 1, bismuth ferrate manganate or barium titanate was not solely detected, and the peak derived from the perovskite structure and the peak derived from the substrate were observed. In Example 5, in addition to the peaks, the peak which is presumed to be derived from a hetero phase was observed around $2\theta=30°$.

Other Embodiments

One embodiment of the invention is described above, but the basic configuration of the invention is not limited to one described above. For example, although the silicon single crystal substrate is mentioned as an example of the flow path formation substrate 10 in the embodiment described above, the invention is not limited thereto. For example, materials, such as an SOI substrate and glass, may be used.

Furthermore, in the embodiment described above, although the piezoelectric element 300 in which the first electrode 60, the piezoelectric layer 70, and the second electrode 80 are successively laminated on the substrate (flow path formation substrate 10) is mentioned as an example, the invention is not limited thereto. For example, the invention can be applied also to a longitudinal oscillation type piezoelectric element in which a piezoelectric material and an electrode formation material are alternately laminated and which is made to expand and contract in the axial direction.

Figure 12:
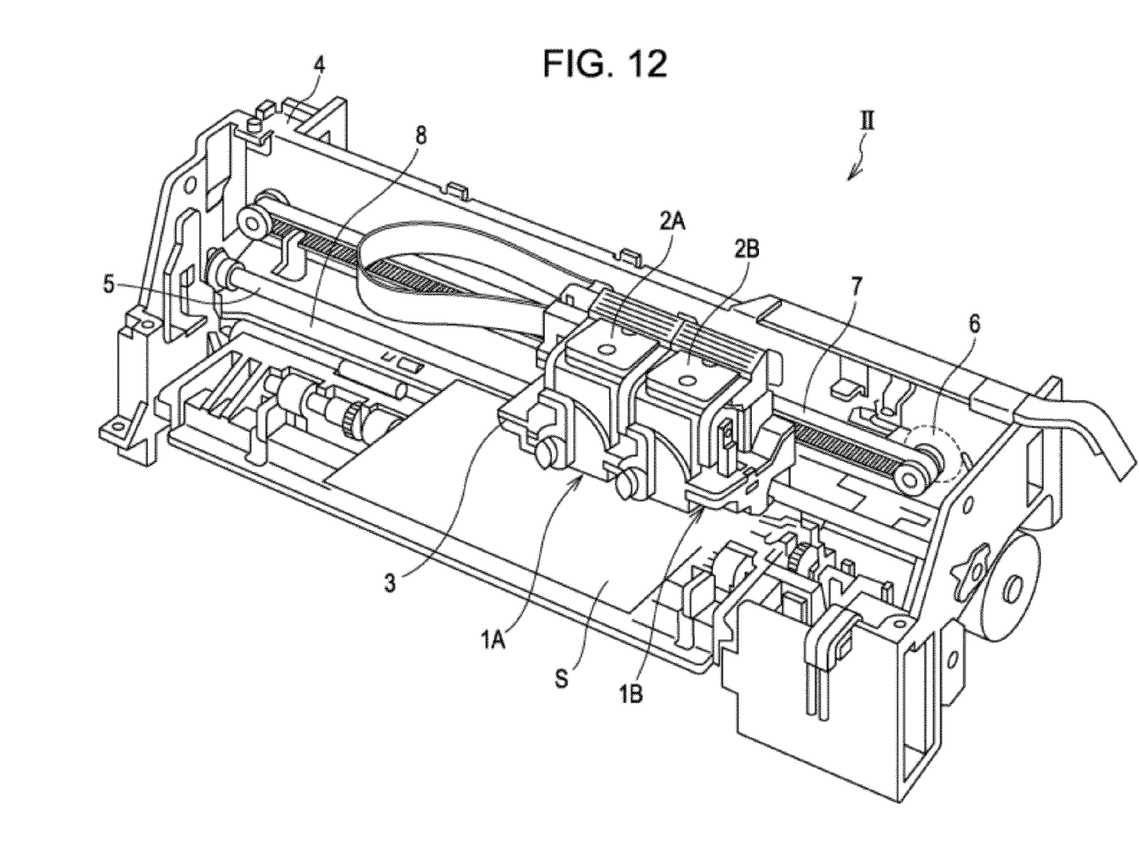
FIG. 12 is a view schematically illustrating the structure of a recording device according to one embodiment of the invention.

The ink jet recording heads of these embodiments constitute a part of a recording head unit having an ink flow path communicating with an ink cartridge or the like and is mounted on an ink jet recording device. FIG. 12 is a view schematically illustrating one example of the ink jet recording device.

In an ink jet recording device II illustrated in FIG. 12, recording head units 1A and 1B having the ink jet recording head I are detachably provided with cartridges 2A and 2B constituting an ink supply unit, respectively, and a carriage 3 on which the recording head units 1A and 1B are mounted is provided to a carriage shaft 5 attached to a device body 4 in such a manner as to freely move in the axial direction. It is configured so that the recording head units 1A and 1B eject a black ink composition and a color ink composition, respectively, for example.

The carriage 3 on which the recording head units 1A and 1B are mounted is moved along the carriage shaft 5 by the transmission of the driving force of a drive motor 6 to the carriage 3 through a plurality of gears (not illustrated) and a timing belt 7. In the device body 4, a platen 8 is provided along the carriage shaft 5, and it is configured so that a recording sheet S which is a recording medium, such as paper, which is fed to a paper feed roller or the like (not illustrated) is wound around the platen 8 to be transported.

Although the embodiments described above describe the ink jet recording head as an example of a liquid ejecting head, the invention is widely targeted to general liquid ejecting heads. It is a matter of course that the invention can be applied to liquid ejecting heads which eject liquid other than ink. Mentioned as other liquid ejecting heads are, for example, various kinds of recording heads for use in image recording devices, such as printers, color material ejecting heads for use in the manufacturing of color filters of liquid crystal displays, electrode material ejecting heads for use in the formation of electrodes of organic EL displays, FED (Field Emission Display), and the like, biological organic material ejecting heads for use in the manufacturing of biochips, and the like.

The invention is not limited to the piezoelectric element mounted on liquid ejecting heads typified by ink jet recording heads and can also be applied to piezoelectric elements mounted on other devices, such as pyroelectric elements, such as ultrasonic devices, e.g., an ultrasonic transmitter, an ultrasonic motor, a pressure sensor, and IR sensor. The invention can be similarly applied also to ferroelectric elements, such as a ferroelectric memory.

What is claimed is:

1. A piezoelectric element, comprising:
a piezoelectric layer consisting of a complex oxide represented as a mixed crystal including bismuth ferrate and barium titanate; and
an electrode provided to the piezoelectric layer,
wherein the piezoelectric layer contains 1 to 15 mol % of lithium relative to the complex oxide, and
wherein the piezoelectric layer is preferentially oriented around a (110) plane.

2. The piezoelectric element according to claim 1, wherein the piezoelectric layer contains a piezoelectric material containing 1 to 10 mol % of lithium relative to the complex oxide.

3. The piezoelectric element according to claim 1, wherein the piezoelectric layer is a thin film having a thickness of 2 μm or less.

4. A liquid ejecting head comprising the piezoelectric element according to claim 1.

5. A liquid ejecting apparatus comprising the liquid ejecting head according to claim 4.

* * * * *